(12) United States Patent
Raffner

(10) Patent No.: US 9,693,399 B1
(45) Date of Patent: Jun. 27, 2017

(54) DETECTION OF MELT ADJACENT TO THE EXTERIOR OF THE BUSHING IN AN INDUCTION CHANNEL FURNACE

(71) Applicant: Inductotherm Corp., Rancocas, NJ (US)

(72) Inventor: Bernard M. Raffner, Moorestown, NJ (US)

(73) Assignee: INDUCTOTHERM CORP., Rancocas, NJ (US)

( * ) Notice: Subject to any disclaimer, the term of this patent is extended or adjusted under 35 U.S.C. 154(b) by 0 days.

(21) Appl. No.: 15/347,049

(22) Filed: Nov. 9, 2016

Related U.S. Application Data

(62) Division of application No. 13/291,669, filed on Nov. 8, 2011, now Pat. No. 9,506,820.

(60) Provisional application No. 61/411,118, filed on Nov. 8, 2010.

(51) Int. Cl.
| | |
|---|---|
| *H05B 6/28* | (2006.01) |
| *H05B 6/06* | (2006.01) |
| *G01R 27/08* | (2006.01) |
| *F27D 21/00* | (2006.01) |

(52) U.S. Cl.
CPC ............... *H05B 6/28* (2013.01); *G01R 27/08* (2013.01); *H05B 6/067* (2013.01); *F27D 2021/0085* (2013.01)

(58) Field of Classification Search
CPC combination set(s) only.
See application file for complete search history.

(56) References Cited

U.S. PATENT DOCUMENTS

| | | | | |
|---|---|---|---|---|
| 1,595,968 A | * | 8/1926 | Unger | H05B 6/20 373/159 |
| 1,878,532 A | * | 9/1932 | Northrup | H05B 6/367 373/154 |
| 2,993,943 A | * | 7/1961 | Cooke | H05B 6/20 373/164 |
| 3,223,519 A | * | 12/1965 | Schippereit | C21C 5/5241 219/674 |
| 3,987,236 A | * | 10/1976 | Kohler | F27D 1/1636 219/625 |
| 4,112,286 A | * | 9/1978 | Alderman | H05B 6/06 219/663 |
| 4,612,498 A | * | 9/1986 | Smalley | H05B 6/28 324/503 |
| 4,675,879 A | * | 6/1987 | Meredith | H05B 6/24 373/155 |
| 6,148,018 A | * | 11/2000 | Garcia | H05B 6/28 338/254 |
| 6,194,890 B1 | * | 2/2001 | Doyle | G01N 27/205 137/145 |

(Continued)

*Primary Examiner* — Quang D Thanh
*Assistant Examiner* — Renee Larose
(74) *Attorney, Agent, or Firm* — Philip O. Post

(57) ABSTRACT

A method is provided for the detection of melt adjacent to the exterior of a bushing in an induction channel furnace. An electrically conductive mesh is disposed around the exterior surface of the bushing facing a refractory that separates the bushing from a channel in which molten metal (melt) flows. The mesh is connected to a grounded voltage source so that when an electrically conductive melt at ground potential in the channel breaches the refractory and penetrates the electrically conductive mesh an electrical circuit is completed through the melt and the grounded voltage source.

4 Claims, 2 Drawing Sheets

(56) References Cited

U.S. PATENT DOCUMENTS

| | | | | |
|---|---|---|---|---|
| 6,208,682 B1 * | 3/2001 | Archenholtz | ............ | H05B 6/20 |
| | | | | 373/159 |
| 2007/0125771 A1 * | 6/2007 | Uchida | ................. | A45D 20/12 |
| | | | | 219/662 |
| 2008/0253425 A1 * | 10/2008 | Raffner | ................. | F27B 14/065 |
| | | | | 373/159 |
| 2009/0323756 A1 * | 12/2009 | Tenzek | ..................... | H05B 6/24 |
| | | | | 373/138 |

\* cited by examiner

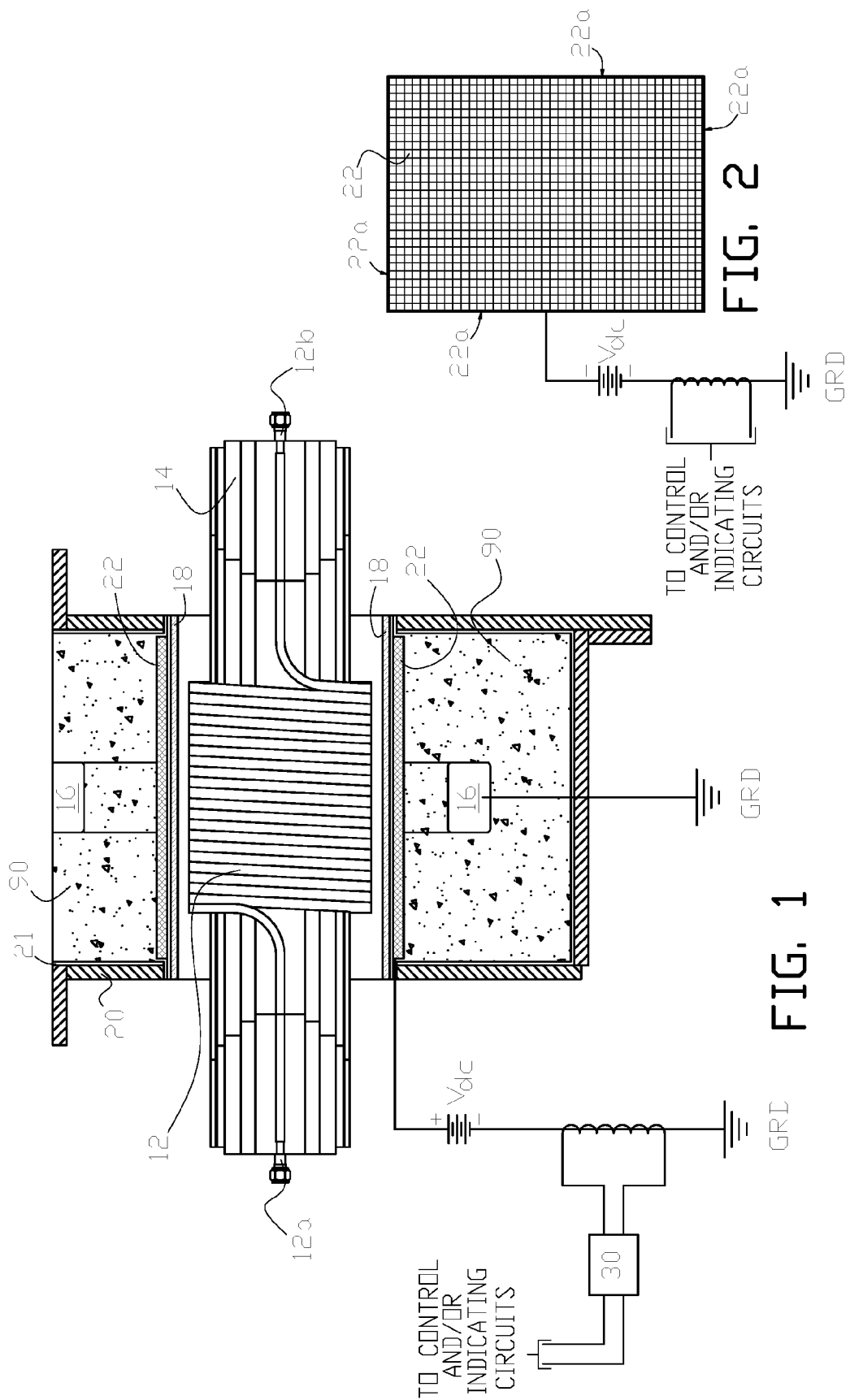

DETECTION OF MELT ADJACENT TO THE EXTERIOR OF THE BUSHING IN AN INDUCTION CHANNEL FURNACE

CROSS-REFERENCE TO RELATED APPLICATIONS

This is a divisional application of application Ser. No. 13/291,669, filed Nov. 8, 2011, which application claims the benefit of U.S. Provisional Application No. 61/411,118, filed Nov. 8, 2010, both of which applications are hereby incorporated herein by reference in their entireties.

FIELD OF THE INVENTION

The present invention relates to detection of melt adjacent to the bushing in an electric induction channel furnace.

BACKGROUND OF THE INVENTION

United States Patent Application Publication No. 2008/0106830 A1 discloses an induction channel furnace with a melt to bushing current detector. Melt in the loop is intentionally ungrounded and must be at an above ground potential for the detector to operate. A wire conductor connects the electrically conductive bushing to a ground current detector. The current detector depends upon the potential differential between the melt in the loop and ground potential so that when melt penetrates the refractory and comes in contact with the electrically conductive bushing, a current flow is established between the bushing (now at the above ground potential of the melt in the loop) and electrical ground. The magnitude of ground circuit current can be monitored and used to disconnect power to the furnace coil when the melt penetrates the refractory and comes in contact with the bushing.

U.S. Pat. No. 6,208,682 B1 discloses an induction channel furnace without a cooling jacket (bushing). The furnace utilizes two fire (or detection) walls 21 and 22 to ensure that melt from the loop does not penetrate through refractory to the furnace coil. Wall 21 is farther away from the coil than wall 22. First fire wall 21 is cylindrical and coaxially arranged around the furnace coil. The first fire wall is formed from an open electrically conductive material (metallic net or mesh) that is backed on both sides with mica insulation. The second fire wall 22 is similarly formed as the first fire wall and optionally of heavier gauge wire than the first fire wall to reinforce the refractory. Measuring the resistance between the first and second fire wall is also disclosed.

It is one object of the present invention to provide for detection of melt adjacent to the bushing in an induction channel furnace while keeping the melt in the loop at ground potential and without utilizing an electromagnetically induced voltage for the detection circuit.

SUMMARY OF THE INVENTION

In one aspect the present invention is a method of detecting the presence of melt adjacent to the exterior surface of a bushing in an electric induction channel furnace. In one example of the invention an arrangement of spaced apart and interconnected electrical conductors is located around the exterior surface of the bushing and electrically connected to a grounded voltage source. An increased level of ground circuit current is detected when an electrically conductive melt at electrical ground potential in the channel of the furnace penetrates the refractory separating the channel from the arrangement of spaced apart and interconnected electrical conductors and establishes electrical continuity between at least some of the spaced apart and interconnected electrical conductors.

The above and other aspects of the invention are further set forth in this specification and the appended claims.

BRIEF DESCRIPTION OF THE DRAWINGS

For the purpose of illustrating the invention, there is shown in the drawings a form which is presently preferred. It being understood, however, that this invention is not limited to the precise arrangements and instrumentalities shown.

FIG. 1 is one example of a melt detector of the present invention with a channel furnace partially shown in pertinent cross section.

FIG. 2 is one example of an electrically conductive mesh and circuit used in the present invention.

DETAILED DESCRIPTION OF THE INVENTION

Figure 3:
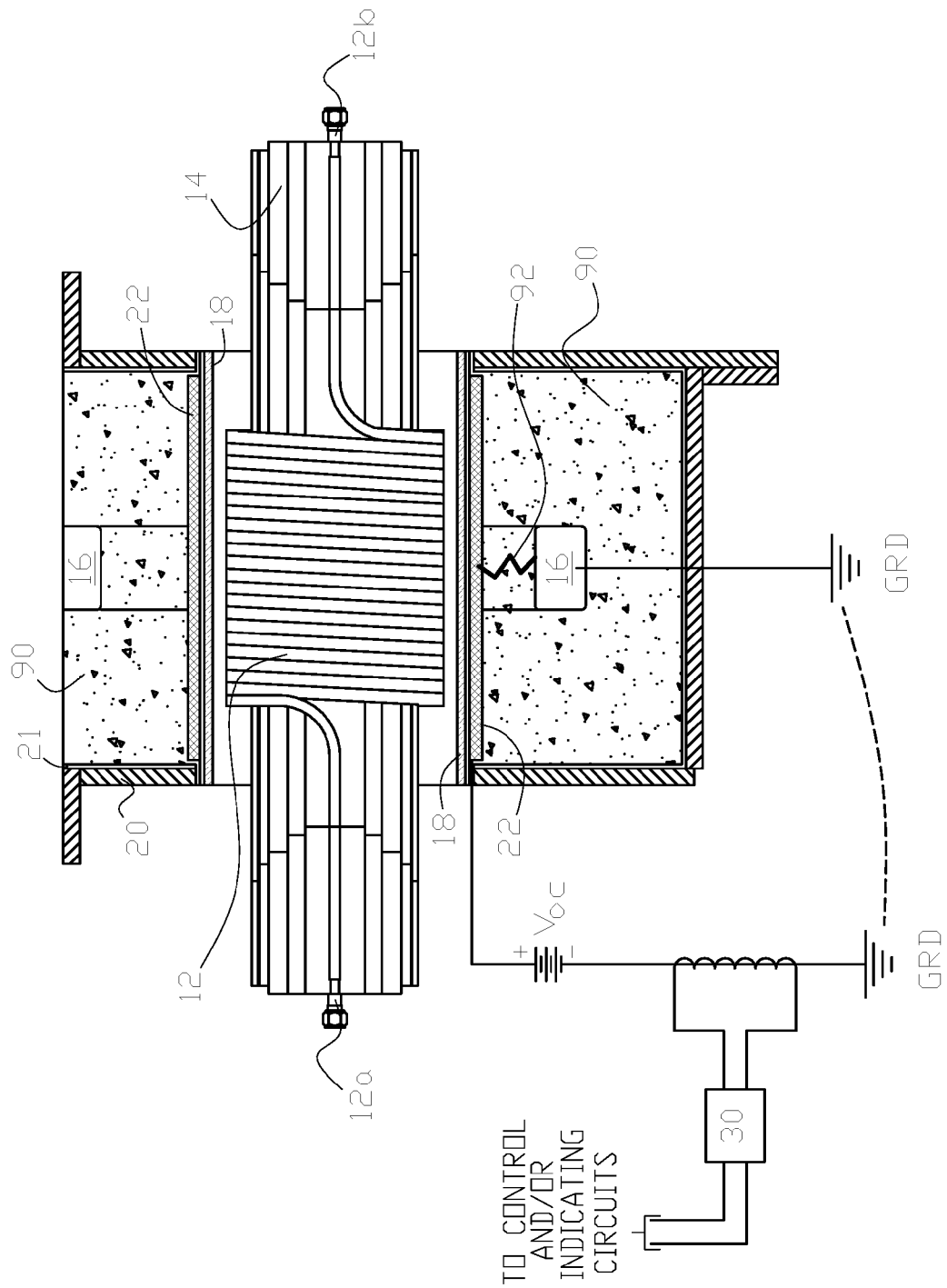
FIG. 3 is the arrangement shown in FIG. 1 with a melt breach of the refractory in the channel furnace.

While the present invention will be described in connection with a preferred embodiment, it will be understood that it is not intended to limit the invention to that embodiment. On the contrary, it is intended to cover all alternatives, modifications and equivalents as may be included within the scope of the invention.

FIG. 1 illustrates one example of an apparatus and method for detection of melt adjacent to the bushing in an induction channel furnace. Induction coil 12 is wound around transformer core 14 so that when alternating current is applied across coil terminals 12a and 12b magnetic flux generated by current flow through the coil electromagnetically couples with an electrically conductive liquid, such as a molten metal (or melt) flowing through loop (channel) 16 around the coil.

Bushing 18 physically and thermally isolates the coil and core from heat generated in the loop and is typically formed from a discontinuous electrically conductive material that may be generally cylindrical in shape. A cooling medium can be circulated though the bushing to remove heat from the furnace.

Refractory 90 separates loop 16 from the bushing and is also contained by coil and core casing 20. Core casing 20 can be spaced apart from refractory 90 by an electrical insulating material 21 such as mica.

A two dimensional array of electrical conductors form an electrically conductive mesh 22, which is shown in cross section in FIG. 1 and FIG. 3, and in plane view in FIG. 2. Mesh 22 forms a sheath at least partially around the outer surface of bushing 18 (as shown in cross section in FIG. 1 and FIG. 3) with a layer of electrical insulating material, such as mica, separating at least the side of the mesh facing the outer surface of the bushing if the outer surface of the bushing is formed from an electrically conductive material. Generally the electrically conductive sheath will not entirely close around a cylindrical bushing to avoid induced currents in the sheath from the magnetic flux established by current flow in the induction coil. The degree of partial surrounding of the bushing with the mesh depends on the regions of breach of the refractory from the channel to the exterior surface of the bushing in a particular arrangement. In some arrangements the mesh may substantially surround the exterior of the bushing. The electrical conductors making up the mesh are arranged so that they are all electrically joined together at their end terminations, which are diagrammatically illustrated in FIG. 2 by the solid thick lines 22a around the outer perimeter of the mesh. Alternatively the individual conductors making up the mesh may be electrically connected to each other within the mesh so that, for example, only the individual conductors on a single side of the mesh are connected together. Consequently, in a particular arrangement of the present invention, if an electrically conductive liquid (melt) fills at least some openings in the mesh, or otherwise establishes electrical continuity between the mesh conductors, the mesh forms a closed circuit with the liquid. One suitable commercial material for the electrically conductive mesh is "COGE-TEC T" available from Cogebi, Inc., Dover, N.H.

In other examples of the invention, the mesh may be formed in other geometrical arrangements of electrical conductors. For example the mesh may be formed by spirally wound conductors along the exterior axial length of the bushing in overlapping "wound" and "counter-wound" windings. Generally the mesh can be an arrangement of spaced apart and interconnected electrical conductors.

A grounded source $V_{dc}$ of suitable electric potential, such as, but not limited to, 24 volts DC, is applied to the interconnected end terminations of the mesh.

If there is a breach 92 of refractory by an electrically conductive melt at ground potential from loop (channel) 16 penetrating the mesh, or otherwise establishing electrical continuity between the conductors making up the mesh, as shown in FIG. 3, then sufficient current flows through the ground loop circuit established by the melt at ground potential. The breach may be any type of defect in the refractory that allows a flow path for the melt from within the interior of the loop to the mesh. Ground detector 30 will detect the increased ground current level and can output a control and/or indicating signal(s), for example audible and/or visual, to alert an operator of the breach and/or remove power from induction coil 12. Grounding of the melt in the furnace can be accomplished by conventional methods for a channel furnace system ground (GRD).

In its broadest sense, the term "electrically conductive mesh" as used herein is understood to mean any arrangement of electrical conductors that can be positioned around the outer surface of the bushing so that when an electrically conductive melt makes contact with at least a partial region of the arrangement of electrical conductors the mesh will be at the electric potential of the melt.

In it broadest sense, the term "electric induction channel furnace" comprises any electric induction apparatus wherein a core wound induction coil is physically isolated from an electrically conductive liquid and is used to electromagnetically heat or stir the liquid when it is in the presence of a magnetic flux generated by the flow of alternating current through the induction coil. A typical, but non-limiting construction of an electric induction channel furnace is disclosed in U.S. Patent Application Publication No. 2008/0253425 A1, which is incorporated herein by reference in its entirety. In its broadest sense, the term "molten metal channel," "channel" or "loop" is any region in the presence of the magnetic flux, whether the region is an enclosed passage containing the liquid, or an open volume of the liquid separated from the mesh surrounding the exterior surface of the bushing by a refractory in a channel furnace.

The present invention has been described in terms of preferred examples and embodiments. Equivalents, alternatives and modifications, aside from those expressly stated, are possible and within the scope of the invention.

The invention claimed is:

1. A method of detecting the presence of a molten metal adjacent to the exterior surface of a bushing in an induction channel furnace, the method comprising the step of forming an electrical circuit from a voltage source electrically connected to an arrangement of spaced apart and interconnected electrical conductors disposed at least partially around the exterior surface of the bushing, the voltage source connected to an electric ground potential, the arrangement of spaced apart and interconnected electrical conductors separated from a molten metal channel in the induction channel furnace by a refractory, the molten metal channel containing the molten metal at the electric ground potential, and the molten metal adjacent to the exterior surface of the bushing flowing from a breach in the refractory from the molten metal channel.

2. The method of claim 1 further comprising the step of detecting an increased ground current level in the electrical circuit from the breach in the refractory.

3. The method of claim 2 further comprising the step of visually or audibly announcing the increased ground current level.

4. The method of claim 2 further comprising the step of disconnecting electric power to an induction coil used in the induction channel furnace when the increased ground current level is detected.

* * * * *